US012796345B2

(12) United States Patent
Ito et al.

(10) Patent No.: US 12,796,345 B2
(45) Date of Patent: Nov. 10, 2026

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Takumi Ito, Toyama (JP); Kiyohisa Ishibashi, Toyama (JP); Kotaro Murakami, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 480 days.

(21) Appl. No.: 18/451,999

(22) Filed: Aug. 18, 2023

(65) Prior Publication Data

US 2023/0395378 A1 Dec. 7, 2023

Related U.S. Application Data

(63) Continuation of application No. PCT/JP2021/006327, filed on Feb. 19, 2021.

(51) Int. Cl.

| | |
|---|---|
| ***H10P 14/24*** | (2026.01) |
| ***C23C 16/24*** | (2006.01) |
| ***C23C 16/44*** | (2006.01) |
| ***C23C 16/455*** | (2006.01) |
| ***H10P 14/20*** | (2026.01) |

(52) U.S. Cl.
CPC .............. *H10P 14/24* (2026.01); *C23C 16/24* (2013.01); *C23C 16/4412* (2013.01);
(Continued)

(58) Field of Classification Search
CPC .. H10P 14/24; H10P 14/3444; H10P 14/3411; C23C 16/24
See application file for complete search history.

(56) References Cited

U.S. PATENT DOCUMENTS 8,012,859 B1 * 9/2011 Joe ...................... C23C 16/0227 438/503
2006/0073679 A1 * 4/2006 Airaksinen ............. C23C 16/24 257/E21.106
(Continued)

FOREIGN PATENT DOCUMENTS

JP 2008-053605 A 3/2008
JP 2013082986 A 5/2013
(Continued)

OTHER PUBLICATIONS

Korean Office Action issued on Sep. 4, 2024 for Korean Patent Application No. 20237016915.
(Continued)

*Primary Examiner* — Steven M Page
(74) *Attorney, Agent, or Firm* — Volpe Koenig

(57) ABSTRACT

There is provided a technique that includes: (a) supplying a group 14 element-containing gas to a substrate; and (e) performing a cycle a predetermined number of times after (a). The cycle includes: (b) supplying a dopant gas containing a halide of a group 13 element or a group 15 element to the substrate; (c) supplying a first reducing gas to the substrate; and (d) supplying the group 14 element-containing gas to the substrate in this order.

16 Claims, 6 Drawing Sheets

(52) U.S. Cl.
CPC .. *C23C 16/45561* (2013.01); *C23C 16/45578* (2013.01); *H10P 14/3411* (2026.01); *H10P 14/3444* (2026.01)

(56) References Cited

U.S. PATENT DOCUMENTS

| | | | | |
|---|---|---|---|---|
| 2011/0269315 | A1* | 11/2011 | Hasebe | C23C 16/22 438/758 |
| 2020/0194250 | A1* | 6/2020 | Harada | C23C 16/045 |
| 2020/0194269 | A1* | 6/2020 | Ogawa | C23C 16/34 |
| 2021/0292902 | A1* | 9/2021 | Kajbafvala | C23C 16/24 |
| 2021/0388487 | A1* | 12/2021 | Ashitani | C23C 16/303 |

FOREIGN PATENT DOCUMENTS

| | | | |
|---|---|---|---|
| JP | 2013-197307 | A | 9/2013 |
| JP | 2013222725 | A | 10/2013 |
| JP | 2020043262 | A | 3/2020 |
| JP | 2020170752 | A | 10/2020 |
| KR | 2013-0035913 | A | 4/2013 |
| KR | 2013-0116173 | A | 10/2013 |
| KR | 2020-0030451 | A | 3/2020 |
| WO | 2011/123369 | A1 | 10/2011 |

OTHER PUBLICATIONS

Japanese Office Action issued on Jul. 16, 2024 for Japanese Patent Application No. 2023-500456.

* cited by examiner

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a Bypass Continuation Application of PCT International Application No. PCT/JP2021/006327, filed on Feb. 19, 2021, the entire contents of which are incorporated herein by reference.

BACKGROUND

Field

The present disclosure relates to a method of processing a substrate, a method of manufacturing a semiconductor device, a substrate processing apparatus, and a recording medium.

Description of the Related Art

As one of the processes of manufacturing a semiconductor device, a process of forming a film on a substrate may be performed.

SUMMARY

Some embodiments of the present disclosure provide a technique capable of forming a film doped with a group 13 element or a group element, containing a group 14 element as a main element, and with small surface roughness, on a substrate.

According to some embodiments of the present disclosure, there is provided a technique that includes:

(a) supplying a group 14 element-containing gas to a substrate; and (e) performing a cycle a predetermined number of times after (a), the cycle including: (b) supplying a dopant gas containing a halide of a group 13 element or a group 15 element to the substrate; (c) supplying a first reducing gas to the substrate; and (d) supplying the group 14 element-containing gas to the substrate in this order.

DETAILED DESCRIPTION

Embodiments of the Present Disclosure

Figure 1:
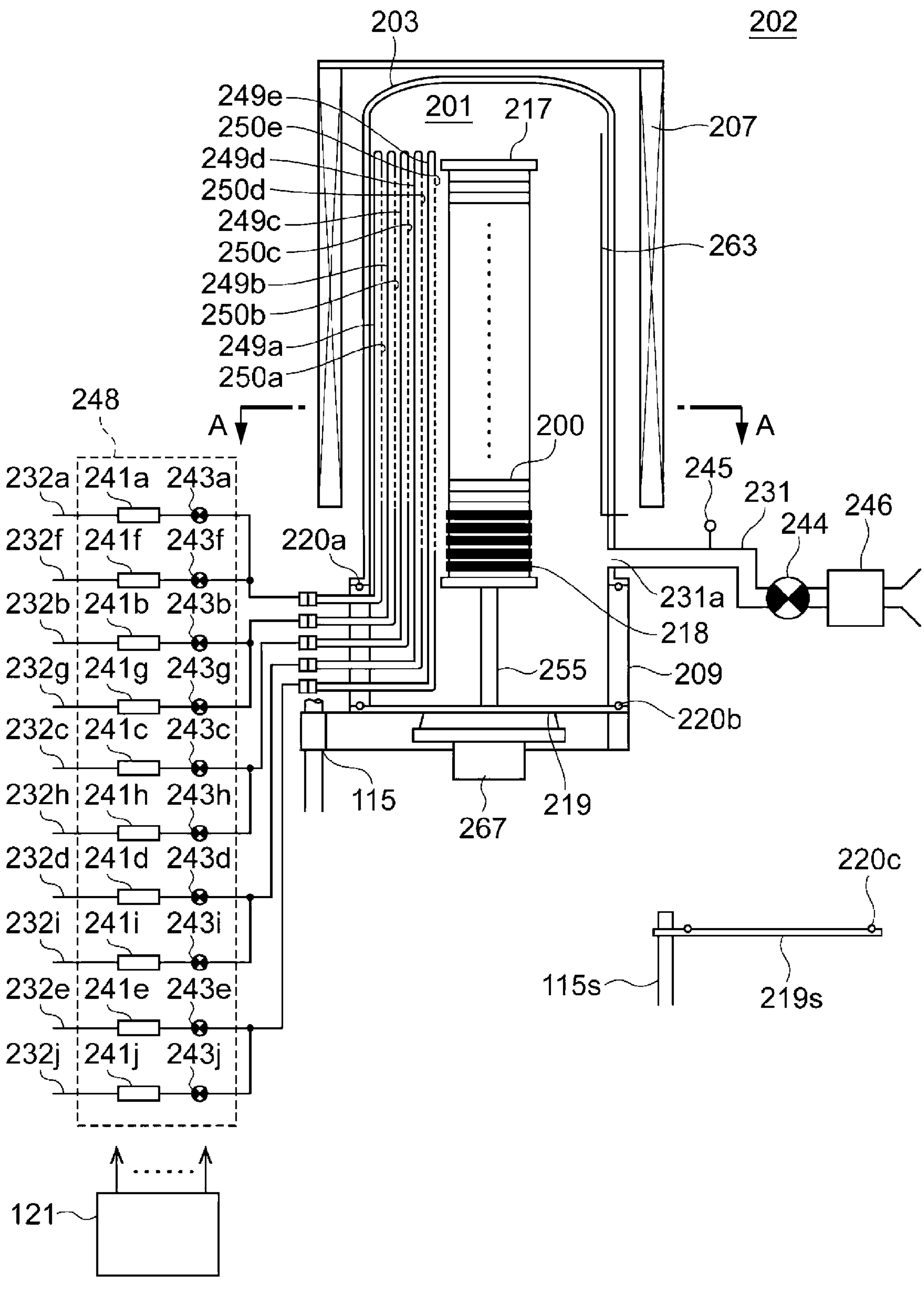
FIG. 1 is a schematic configuration view of a vertical process furnace of a substrate processing apparatus suitably used in some embodiments of the present disclosure, and is a view illustrating a longitudinal cross section of a portion of a process furnace 202.

Some embodiments of the present disclosure will be described below with reference to FIGS. 1 to 6. Furthermore, the drawings used in the following description are all schematic, and thus, dimensional relationships between constituent elements, ratios between constituent elements, and the like illustrated in the drawings do not necessarily coincide with realities. In addition, for example, a plurality of drawings do not necessarily coincide with one another in dimensional relationships between constituent elements, ratios between constituent elements, and the like.

(1) Configuration of Substrate Processing Apparatus

As illustrated in FIG. 1, a process furnace 202 includes a heater 207 serving as a temperature regulator. The heater 207 is cylindrical in shape and is vertically installed by being supported by a holding plate. The heater 207 also functions as an activator (exciter) that thermally activates (excites) a gas.

Inside the heater 207, a reaction tube 203 is disposed concentrically with the heater 207. The reaction tube 203 is made of, for example, a heat-resistant material such as quartz ($SiO_2$) or silicon carbide (SiC), and is formed in a cylindrical shape with an upper end closed and a lower end opened. A manifold 209 is disposed below the reaction tube 203 concentrically with the reaction tube 203. The manifold 209 is made of, for example, a metal material, such as stainless steel (SUS), and is formed in a cylindrical shape with an upper end and a lower end opened. An upper end portion of the manifold 209 is engaged with a lower end portion of the reaction tube 203 and is configured to support the reaction tube 203. An O-ring **220*a* serving as a seal is provided between the manifold 209 and the reaction tube 203. The reaction tube 203 is vertically installed, similarly to the heater 207. A process container (reaction container) mainly includes the reaction tube 203 and the manifold 209. A process chamber 201 is formed in a cylindrical hollow portion of the process container. The process chamber 201 is configured to be capable of housing wafers 200 serving as substrates. The wafers 200 are processed in the process chamber 201**.

In the process chamber 201, nozzles **249*a* to 249*e* serving as first to fifth suppliers, respectively, are provided so as to penetrate the side wall of the manifold 209. Gas supply pipes 232*a* to 232*e* are connected to the nozzles 249*a* to 249*e*, respectively. The nozzles 249*a* to 249*e* are nozzles independent of one another, and the nozzles 249*b* and 249*d* are provided adjacent to the nozzle 249*c*. The nozzle 249*a* is provided adjacent to the nozzle 249*b* on a side opposite to the side where the nozzle 249*b* is adjacent to the nozzle 249*c*. The nozzle 249*e* is provided adjacent to the nozzle 249*d* on a side opposite to the side where the nozzle 249*d* is adjacent to the nozzle 249*c***.

The gas supply pipes **232*a* to 232*e* are respectively provided with mass flow controllers (MFCs) 241*a* to 241*e*, each serving as a flow rate controller, and valves 243*a* to 243*e*, each serving as an opening/closing valve, in this order from the upstream side of a gas flow. Gas supply pipes 232*f* to 232*j* are connected to the downstream side of the valves 243*a* to 243*e* of the gas supply pipes 232*a* to 232*e*, respectively. The gas supply pipes 232***f* to 232*j* are respectively provided with MFCs 241*f* to 241*j* and valves 243*f* to 243*j* in this order from the upstream side of a gas flow. The gas supply pipes 232*a* to 232*e* are made of, for example, a metal material such as SUS.

Figure 2:
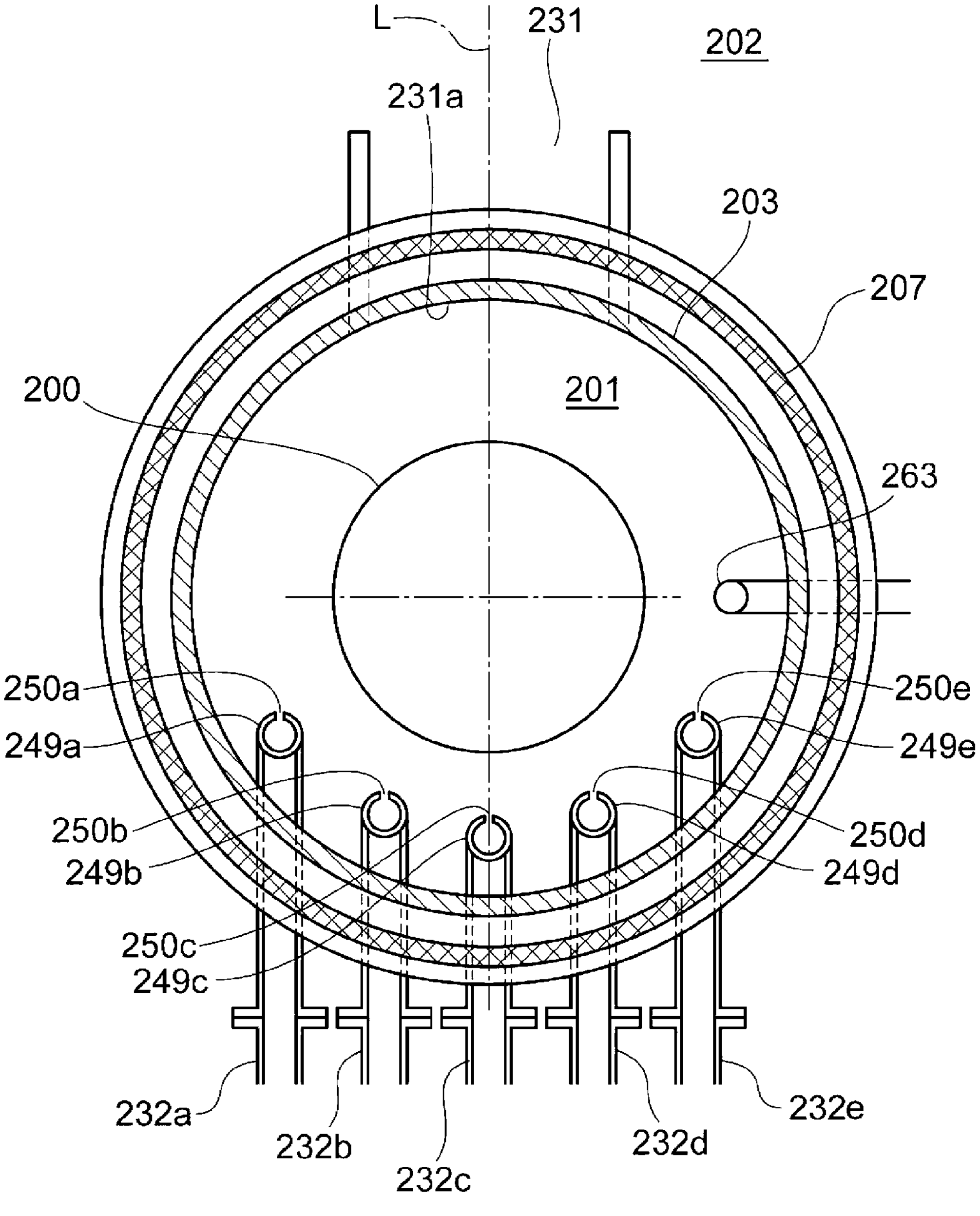
FIG. 2 is a partial schematic configuration view of the vertical process furnace of the substrate processing apparatus suitably used in some embodiments of the present disclosure, and is a view illustrating a cross section of a portion of the process furnace 202 taken along line A-A in FIG. 1.

As illustrated in FIG. 2, the nozzles 249*a* to 249*e* are provided in an annular space between the inner wall of the reaction tube 203 and the wafer 200 in a plan view. The nozzles 249*a* to 249*e* extend upward in an arrangement direction of the wafers 200, along the inner wall of the reaction tube 203 from the lower portion to the upper portion. That is, the nozzles 249*a* to 249*e* are provided along a wafer arrangement region, in a lateral region of the wafer arrangement region where the wafers 200 are arranged. The lateral region horizontally surrounds the wafer arrangement region. In a plan view, the nozzle 249*c* is disposed opposite to an exhaust port 231*a*, described later, on a straight line with the center of the wafer 200, which is loaded into the process chamber 201, sandwiched therebetween. The nozzles 249*b* and 249*d* are disposed so as to sandwich a straight line L passing through the center of the nozzle 249*c* and the center of the exhaust port 231*a*, from both sides along the inner wall of the reaction tube 203 (outer peripheral portions of the wafers 200). In addition, the nozzles 249*a* and 249*e* are disposed so as to sandwich the straight line L from both sides along the inner wall of the reaction tube 203, on sides opposite to the sides where the nozzles 249*b* and 249*d* are adjacent to the nozzle 249*c*. The straight line L passes through the center of the nozzle 249*c* and the center of the wafer 200. That is, it can also be said that the nozzle 249*d* is provided on a side opposite to the nozzle 249*b* with the straight line L sandwiched therebetween. In addition, it can also be said that the nozzle 249*e* is provided on a side opposite to the nozzle 249*a* with the straight line L sandwiched therebetween. The nozzles 249*b* and 249*d* are disposed in line symmetry with the straight line L as a symmetry axis. In addition, the nozzles 249*a* and 249*e* are disposed in line symmetry with the straight line L as a symmetry axis. On side surfaces of the nozzles 249*a* to 249*e*, gas supply holes 250*a* to 250*e* through which a gas is supplied are formed, respectively. The gas supply holes 250*a* to 250*e* are each opened so as to face the exhaust port 231*a* in a plan view, and capable of supplying a gas toward the wafers 200. The gas supply holes 250*a* to 250*e* are formed in the nozzles 249*a* to 249*e*, respectively, in a plural number from the lower portion to the upper portion of the reaction tube 203.

A group 14 element-containing gas is supplied as a process gas from the gas supply pipe 232*a* into the process chamber 201 via the MFC 241*a*, the valve 243*a*, and the nozzle 249*a*.

A dopant gas containing a halide of a group 13 element or a group 15 element is supplied as a dopant gas from the gas supply pipe 232*b* into the process chamber 201 via the MFC 241*b*, the valve 243*b*, and the nozzle 249*b*.

A first reducing gas is supplied as a reducing gas from the gas supply pipe 232*c* into the process chamber 201 via MFC 241*c*, the valve 243*c*, and the nozzle 249*c*.

A first halosilane-based gas is supplied as a process gas from the gas supply pipe 232*d* into the process chamber 201 via the MFC 241*d*, the valve 243*d*, and the nozzle 249*d*.

A second halosilane-based gas is supplied as a process gas from the gas supply pipe 232*e* into the process chamber 201 via the MFC 241*e*, the valve 243*e*, and the nozzle 249*e*.

An inert gas is supplied from the gas supply pipes 232*f* to 232*j* into the process chamber 201 via the MFCs 241*f* to 241*j*, the valves 243*f* to 243*j*, the gas supply pipes 232*a* to 232*e*, and the nozzles 249*a* to 249*e*, respectively. The inert gas acts as a purge gas, a carrier gas, a diluent gas, or the like.

A process gas supply system mainly includes the gas supply pipes 232*a*, 232*d*, and 232*e*, the MFCs 241*a*, 241*d*, and 241*e*, and the valves 243*a*, 243*d*, and 243*e*. The gas supply pipe 232*b*, the MFC 241*b*, and the valve 243*b* may be considered to be included in the process gas supply system. In addition, a reducing gas supply system mainly includes the gas supply pipe 232*c*, the MFC 241*c*, and the valve 243*c*. In addition, an inert gas supply system mainly includes the gas supply pipes 232*f* to 232*j*, the MFCs 241*f* to 241*j*, and the valves 243*f* to 243*j*. Furthermore, in the present disclosure, a gas supply system including the gas supply pipe 232*a*, the MFC 241*a*, and the valve 243*a* is also referred to as a first supply system. The gas supply pipe 232*f*, the MFC 241*f*, and the valve 243*f* may be considered to be included in the first supply system. In addition, a gas supply system including the gas supply pipe 232*b*, the MFC 241*b*, and the valve 243*b* is also referred to as a second supply system. The gas supply pipe 232*g*, the MFC 241*g*, and the valve 243*g* may be considered to be included in the second supply system. In addition, a gas supply system including the gas supply pipe 232*c*, the MFC 241*c*, and the valve 243*c* is also referred to as a third supply system. The gas supply pipe 232*h*, the MFC 241*h*, and the valve 243*h* may be considered to be included in the third supply system. In addition, a gas supply system including the gas supply pipe 232*d*, the MFC 241*d*, and the valve 243*d* is also referred to as the fourth supply system. The gas supply pipe 232*i*, the MFC 241*i*, and the valve 243*i* may be considered to be included in the fourth supply system. In addition, a gas supply system including the gas supply pipe 232*e*, the MFC 241*e*, and the valve 243*e* is also referred to as the fifth supply system. The gas supply pipe 232*j*, the MFC 241*j*, and the valve 243*j* may be considered to be included in the fifth supply system.

Any or all of the various supply systems described above may be configured as an integrated supply system 248 in which the valves 243*a* to 243*j*, MFCs 241*a* to 241*j*, and the like are integrated. The integrated supply system 248 is connected to the gas supply pipes 232*a* to 232*j*, and is configured such that the operations of supplying various gases into the gas supply pipes 232*a* to 232*j*, that is, opening/closing operations of the valves 243*a* to 243*j*, flow rate regulating operations by the MFCs 241*a* to 241*j*, and the like are controlled by the controller 121 described later. The integrated supply system 248 is configured as a single integrated unit or a splittable integrated unit, and is configured to be capable of being attached to or detached from the gas supply pipes 232*a* to 232*j* and the like per integrated unit. Therefore, maintenance, replacement, expansion, and the like of the integrated supply system 248 can be performed on an integrated unit basis.

The exhaust port 231*a* that exhausts the atmosphere inside the process chamber 201 is formed below a side wall of the reaction tube 203. As illustrated in FIG. 2, the exhaust port 231*a* is formed at a location opposite to (facing) the nozzles 249*a* to 249*e* (gas supply holes 250*a* to 250*e*) with the wafers 200 sandwiched therebetween in a plan view. The exhaust port 231*a* may be formed along the side wall of the reaction tube 203 from the lower portion to the upper portion, that is, along the wafer arrangement region. An exhaust pipe 231 is connected to the exhaust port 231*a*. A vacuum pump 246 serving as a vacuum exhaust is connected to the exhaust pipe 231 via a pressure sensor 245 serving as a pressure detector that detects the pressure in the process chamber 201 and an auto pressure controller (APC) valve 244 serving as a pressure regulator. The APC valve 244 is configured to be capable of performing vacuum exhaust and stopping the vacuum exhaust inside the process chamber 201 by opening/closing the valve in a state where the vacuum pump 246 is operated, and to be capable of regulating the pressure in the process chamber 201 by regulating the degree of valve opening, on the basis of pressure information detected by the pressure sensor 245 in a state where the vacuum pump 246 is operated. An exhaust system mainly includes the exhaust pipe 231, the APC valve 244, and the pressure sensor 245. The vacuum pump 246 may be considered to be included in the exhaust system.

A seal cap 219 serving as a furnace opening lid that is capable of hermetically closing a lower end opening of the manifold 209 is provided below the manifold 209. The seal cap 219 is made of, for example, a metal material such as SUS, and is formed in a disk shape. An O-ring 220*b* serving as a seal in contact with the lower end of the manifold 209 is provided on an upper surface of the seal cap 219. A rotator 267 that rotates a boat 217 described later is disposed below the seal cap 219. A rotation shaft 255 of the rotator 267 penetrates the seal cap 219 and is connected to the boat 217. The rotator 267 is configured to rotate the boat 217 to rotate the wafers 200. A boat elevator 115 serving as an elevator mechanism, which is disposed outside the reaction tube 203, is configured to vertically raise and lower the seal cap 219. The boat elevator 115 is configured as a transfer device (transfer mechanism) that loads the wafers 200 into the process chamber 201 or unloads (transfers) the wafers 200 from the process chamber 201 by raising and lowering the seal cap 219. A shutter 219*s* serving as a furnace opening lid that is capable of hermetically closing the lower end opening of the manifold 209 in a state where the seal cap 219 is lowered and the boat 217 is unloaded from the process chamber 201 is provided below the manifold 209. The shutter 219*s* is made of, for example, a metal material such as SUS, and is formed in a disk shape. An O-ring 220*c* serving as a seal in contact with the lower end of the manifold 209 is provided on an upper surface of the shutter 219*s*. The opening/closing operation (a raising/lowering operation, a turning operation, or the like) of the shutter 219*s* is controlled by a shutter opening/closing mechanism 115*s*.

The boat 217 serving as a substrate support is configured to support a plurality of, for example, 25 to 200 wafers 200 in multiple stages, that is, to arrange the wafers 200 at intervals, while the wafers 200 are aligned in the vertical direction in a horizontal posture in a state where the centers aligned with one another. The boat 217 is made of, for example, a heat-resistant material such as quartz or SiC. Heat insulating plates 218 made of, for example, a heat-resistant material such as quartz or SiC are supported on a lower portion of the boat 217 in multiple stages.

A temperature sensor 263 serving as a temperature detector is disposed in the reaction tube 203. The degree of energization to the heater 207 is regulated on the basis of temperature information detected by the temperature sensor 263, so that the temperature in the process chamber 201 is controlled to be a desired temperature distribution. The temperature sensor 263 is provided along the inner wall of the reaction tube 203.

Figure 3:
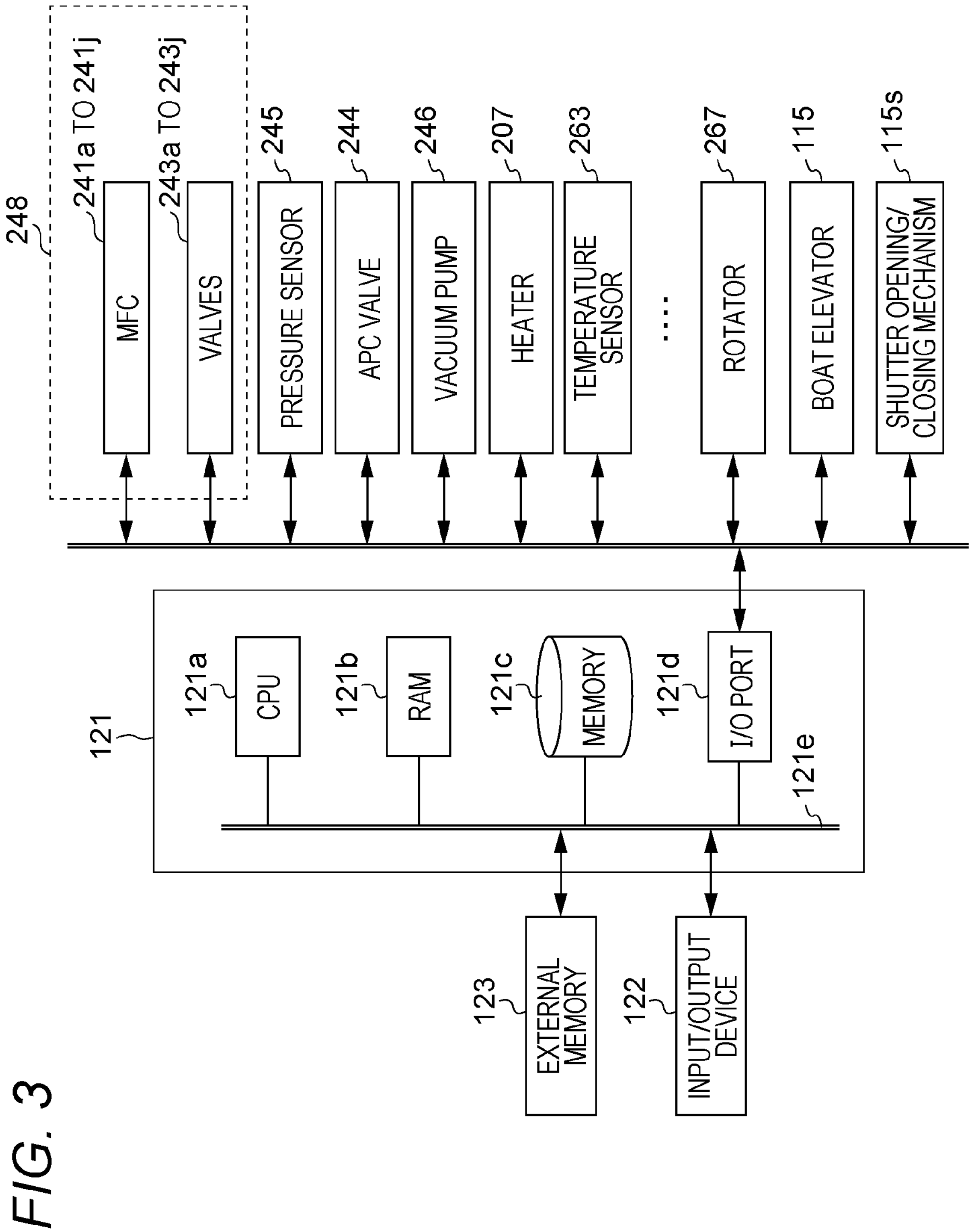
FIG. 3 is a schematic configuration view of a controller 121 of the substrate processing apparatus suitably used in some embodiments of the present disclosure, and is a block diagram illustrating a control system of the controller 121.

As illustrated in FIG. 3, the controller 121 serving as a control means is configured as a computer including a central processing unit (CPU) 121*a*, a random access memory (RAM) 121*b*, a memory 121*c*, and an I/O port 121*d*. The RAM 121*b*, the memory 121*c*, and the I/O port 121*d* are configured to be capable of exchanging data with the CPU 121*a* via an internal bus 121*e*. An input/output device 122 configured as, for example, a touch panel or the like is connected to the controller 121.

The memory 121*c* includes, for example, a flash memory, a hard disk drive (HDD), a solid state drive (SSD), or the like. A control program that controls the operation of a substrate processing apparatus, a process recipe in which procedures, conditions, and the like of substrate processing described later are described, and the like are readably stored in the memory 121*c*. The process recipe is combined so as to function as a program that causes the controller 121 to perform each procedure in the substrate processing, described later, to obtain a predetermined result. Hereinafter, the process recipe, the control program, and the like are also collectively and simply referred to as a program. In addition, the process recipe is simply referred to as a recipe. When the term "program" is used in the present disclosure, it may indicate a case of including the recipe, a case of including the control program, or a case of including both the recipe and the control program. The RAM 121*b* is configured as a memory area (work area) in which the program, data, and the like read by the CPU 121*a* are temporarily stored.

The I/O port 121*d* is connected to the MFCs 241*a* to 241*j*, the valves 243*a* to 243*j*, the pressure sensor 245, the APC valve 244, the vacuum pump 246, the temperature sensor 263, the heater 207, the rotator 267, the boat elevator 115, the shutter opening/closing mechanism 115*s*, and the like described above.

The CPU 121*a* is configured to read the control program from the memory 121*c* and perform the control program, and to read the recipe from the memory 121*c* in response to an input or the like of an operation command from the input/output device 122. The CPU 121*a* is configured to be capable of controlling, in accordance with the content of the read recipe, flow rate regulating operations of various gases by the MFCs 241*a* to 241*j*, opening/closing operations of the valves 243*a* to 243*j*, an opening/closing operation of the APC valve 244, a pressure regulating operation by the APC valve 244 based on the pressure sensor 245, start and stop of the vacuum pump 246, a temperature regulating operation of the heater 207 based on the temperature sensor 263, a rotating operation and a rotation speed regulating operation of the boat 217 by the rotator 267, a raising/lowering operation of the boat 217 by the boat elevator 115, an opening/closing operation of the shutter 219*s* by the shutter opening/closing mechanism 115*s*, and the like.

The controller 121 can be configured by installing the above-described program stored in an external memory 123 into the computer. Examples of the external memory 123 include a magnetic disk such as an HDD, an optical disc such as a CD, a magneto-optical disc such as an MO, a semiconductor memory such as a USB memory or an SSD, and the like. The memory 121*c* and the external memory 123 are each configured as a computer-readable recording medium. Hereinafter, the memory 121*c* and the external memory 123 are also collectively and simply referred to as a recording medium. When the term "recording medium" is used in the present disclosure, it may indicate a case of including the memory 121*c*, a case of including the external memory 123, or a case of including both the memory 121*c* and the external memory 123. Furthermore, the program may be provided to the computer by using a communication means such as the Internet or a dedicated line without using the external memory 123.

(2) Substrate Processing Process

An example of a processing sequence in which a film is formed on a substrate will be described mainly with reference to FIGS. 4 and 5 as one of the processes of manufacturing a semiconductor device using the substrate processing apparatus described above. In the following description, the controller 121 controls the operation of each constituent included in the substrate processing apparatus.

Figure 4:
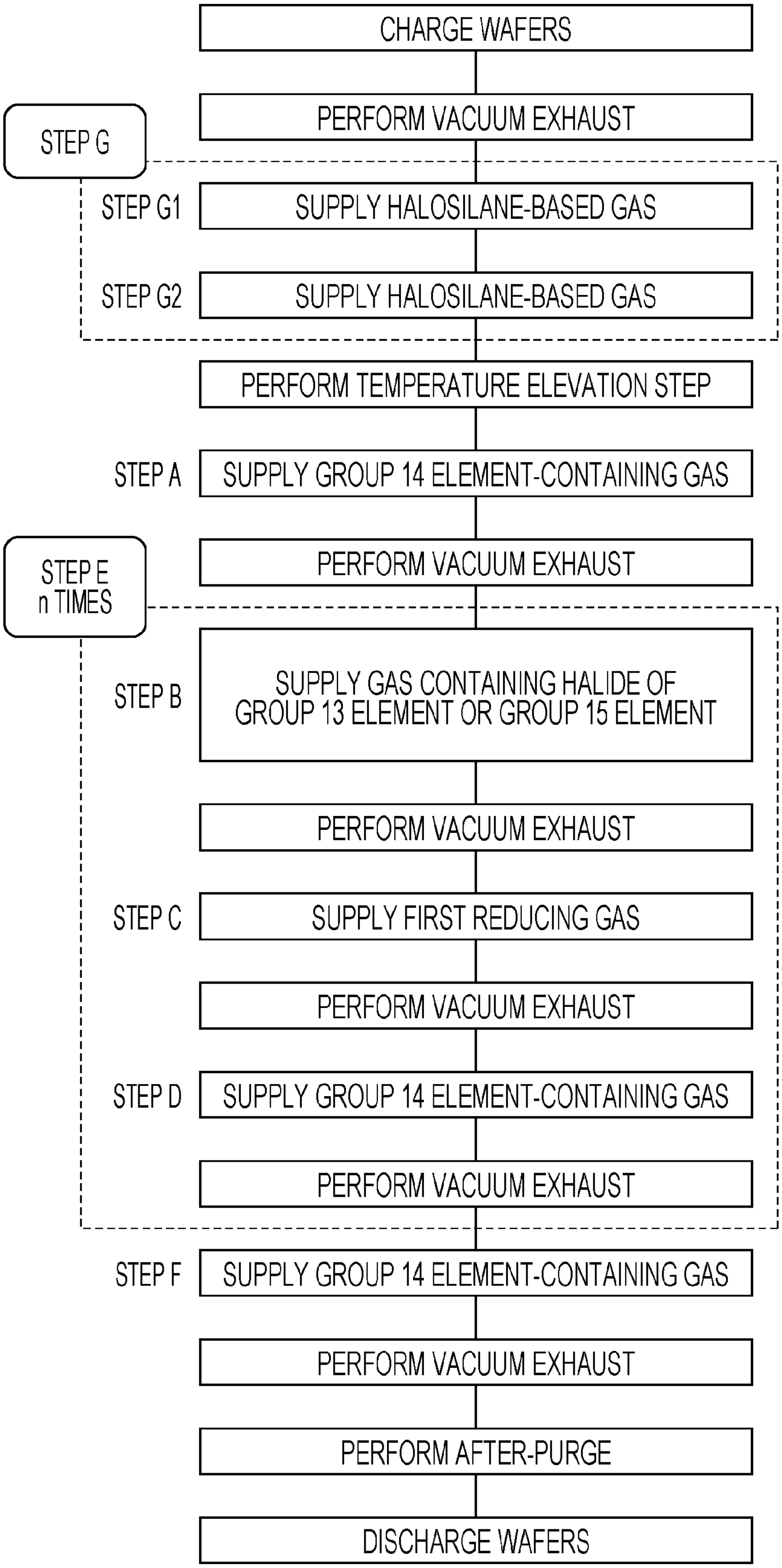
FIG. 4 is a flowchart illustrating a processing sequence in some embodiments of the present disclosure.
Figure 5:
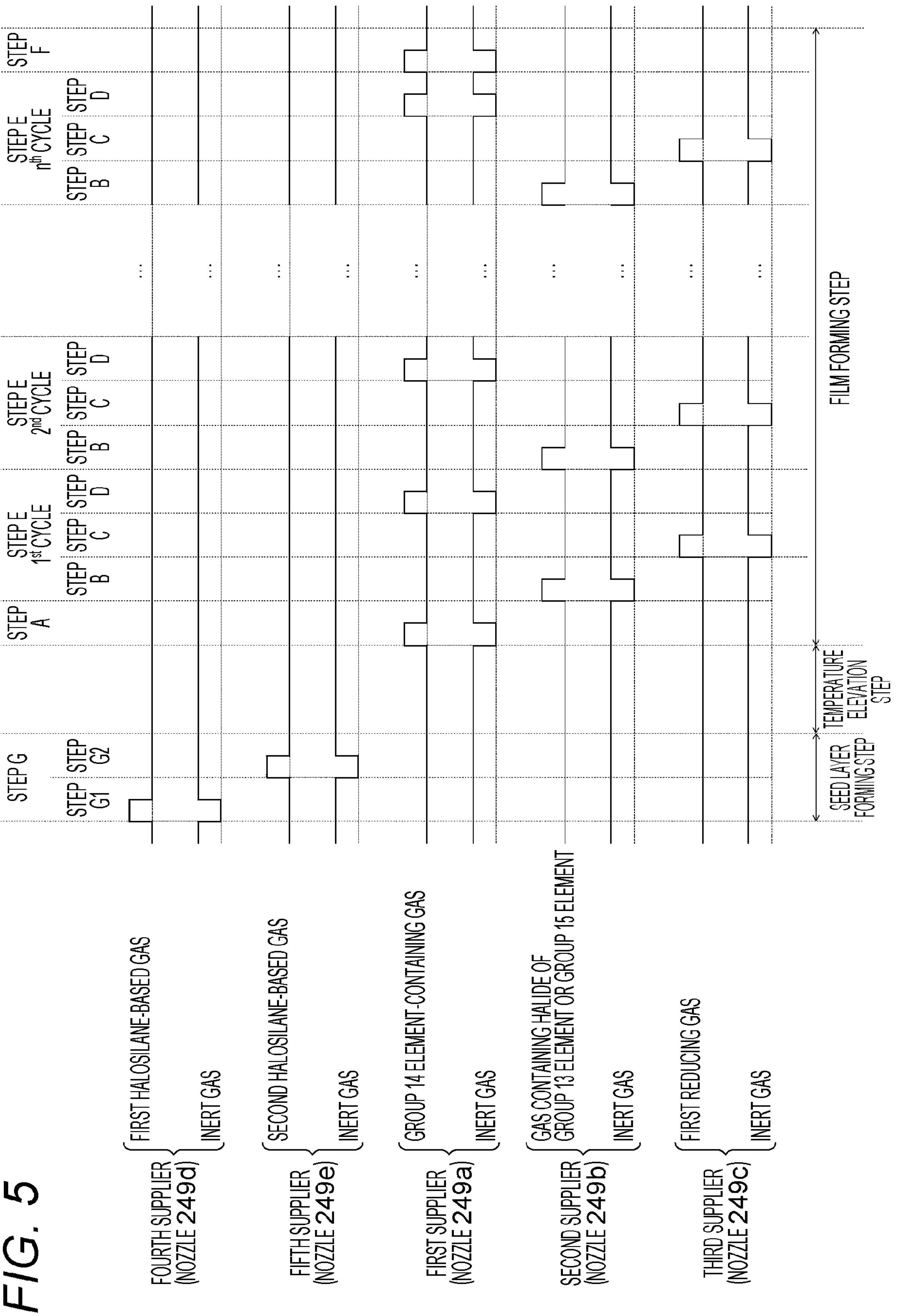
FIG. 5 is a view illustrating the processing sequence in some embodiments of the present disclosure.

The processing sequence illustrated in FIGS. 4 and 5 includes performing:

step A of supplying a group 14 element-containing gas to the wafer 200 serving as a substrate; and step E of performing a cycle a predetermined number of times (n times, n being an integer of two or more) after step A, the cycle including: step B of supplying a dopant gas containing a halide of a group 13 element or a group 15 element to the wafer 200; step C of supplying a first reducing gas to the wafer 200; and step D of supplying the group 14 element-containing gas to the wafer 200 in this order.

Furthermore, step F of supplying the group 14 element-containing gas to the wafer 200 is performed after step E.

By steps A to F, a step (film forming step) of forming a film added (doped) with a group 13 element or a group 15 element and containing a group 14 element as a main element on the wafer 200 is performed. In the present disclosure, the film doped with the group 13 element or the group 15 element and containing the group 14 element as a main element is also referred to as a doped film.

Specifically, the film forming step includes performing:

- step A of supplying a group 14 element-containing gas serving as a process gas from the nozzle **249*a* to the wafer 200**; and
- step E of performing a cycle a predetermined number of times after step A, the cycle including: step B of supplying a dopant gas containing a halide of a group 13 element or a group 15 element serving as a dopant gas from the nozzle **249*b* to the wafer 200; step C of supplying a first reducing gas from the nozzle 249*c* to the wafer 200; and step D of supplying the group 14 element-containing gas serving as a process gas from the nozzle 249*a* to the wafer 200** in this order.

Furthermore, step F of supplying the group 14 element-containing gas serving as a process gas from the nozzle **249*a* to the wafer 200** is performed.

In addition, in a film forming sequence illustrated in FIGS. 4 and 5, step G of supplying two types of halosilane-based gases to the wafer 200 is performed before step A. By step G, a step (seed layer forming step) of forming a seed layer on the wafer 200 is performed.

Specifically, the seed layer forming step includes performing:

- before step A, step G1 of supplying a first halosilane-based gas from the nozzle **249*d* to the wafer 200**; and
- after step G1, step G2 of supplying a second halosilane-based gas different from the first halosilane-based gas from the nozzle **249*e* to the wafer 200**.

In the present disclosure, the above-described film forming sequence may be described as follows for convenience. A similar notation will be used in the following description of modified examples and the like.

First halosilane gas→second halosilane gas-group 14 element-containing gas→(dopant gas containing halide of group 13 element or group 15 element-first reducing gas-group 14 element-containing gas)×n→group 14 element-containing gas When the term "wafer" is used in the present disclosure, it may refer to a wafer itself, or a laminate of a wafer and a predetermined layer or film formed on the surface of the wafer. When the phrase "surface of a wafer" is used in the present disclosure, it may refer to a surface of a wafer itself or a surface of a predetermined layer or the like formed on a wafer. The expression "form a predetermined layer on a wafer" in the present disclosure may mean that a predetermined layer is directly formed on the surface of a wafer itself or that a predetermined layer is formed on a layer or the like formed on a wafer. When the term "substrate" is used in the present disclosure, it may be synonymous with the term "wafer" used in the present disclosure.

(Wafer Charge and Boat Load)

When a plurality of wafers 200 are charged to the boat 217 (wafer charge), the shutter opening/closing mechanism **115*s* moves the shutter 219*s*, and the lower end opening of the manifold 209 is opened (shutter open). Thereafter, as illustrated in FIG. 1, the boat 217 on which the plurality of wafers 200 are supported is lifted up by the boat elevator 115 and is loaded into the process chamber 201 (boat load). In this state, the lower end of the manifold 209 is sealed by the seal cap 219 with the O-ring 220*b*** interposed therebetween.

(Pressure Regulation and Temperature Regulation)

Vacuum exhaust (decompression exhaust) is performed by the vacuum pump 246 such that the pressure in the process chamber 201, that is, a space in which wafers 200 exist, is controlled to be a desired pressure (degree of vacuum). At this time, the pressure sensor 245 measures the pressure in the process chamber 201, and then the APC valve 244 is feedback-controlled on the basis of the measured pressure information. In addition, the heater 207 performs heating such that the temperature of the wafers 200 in the process chamber 201 is controlled to be a desired film forming temperature. At this time, the degree of energization to the heater 207 is feedback-controlled on the basis of the temperature information detected by the temperature sensor 263 such that the temperature in the process chamber 201 is controlled to be a desired temperature distribution. In addition, the rotator 267 starts to rotate the wafers 200. The exhaust in the process chamber 201, the heating to the wafers 200, and the rotation of the wafers 200 each continue at least until the processing for the wafers 200 is completed.

(Seed Layer Forming Step)

Thereafter, steps, that is, step G1 of supplying a first halosilane-based gas and step G2 of supplying a second halosilane-based gas different from the first halosilane-based gas are sequentially performed as the seed layer forming step.

[Step G1]

In this step, a first halosilane-based gas is supplied from the nozzle **249*d* to the wafer 200 in the process chamber 201, and an inert gas is supplied from each of the nozzles 249*a* to 249*c* and 249*e***.

Specifically, the valve **243*d* is opened to cause the first halosilane-based gas to flow through the gas supply pipe 232*d*. The flow rate of the first halosilane-based gas is regulated by the MFC 241*d*, and the first halosilane-based gas is supplied into the process chamber 201 via the nozzle 249*d* and exhausted from the exhaust port 231*a*. At this time, the first halosilane-based gas is supplied to the wafer 200. In addition, at this time, the valves 243*f* to 243*h* and 243*j* are opened to supply the inert gas into the process chamber 201 via each of the nozzles 249*a* to 249*c* and 249*e***.

By supplying the first halosilane-based gas to the wafer 200 under processing conditions described later, a natural oxide film, an impurity, or the like can be removed from the surface of the wafer 200 by a treatment action (etching action) of the first halosilane-based gas. As a result, the surface can be cleaned.

After the surface of the wafer 200 is cleaned, the valve **243*d* is closed to stop the supply of the first halosilane-based gas into the process chamber 201. Then, the inside of the process chamber 201 is vacuum-exhausted to remove the gas and the like remaining in the process chamber 201 from the inside of the process chamber 201. At this time, the valves 243***f* to 243*j* are opened to supply the inert gas into the process chamber 201 via the nozzles 249*a* to 249*e*. The inert gas supplied from the nozzles 249*a* to 249*e* acts as a purge gas. Thus, the inside of the process chamber 201 is purged (purge step).

As the first halosilane-based gas, for example, a chlorosilane-based gas such as a dichlorosilane ($SiH_2Cl_2$, abbreviation: DCS) gas, a monochlorosilane ($SiH_3Cl$, abbreviation: MCS) gas, a tetrachlorosilane ($SiCl_4$, abbreviation: STC) gas, a trichlorosilane ($SiHCl_3$, abbreviation: TCS) gas, a hexachlorodisilane ($Si_2Cl_6$, abbreviation: HCDS) gas, or an octachlorotrisilane ($Si_3Cl_8$, abbreviation: OCTS) gas can be used. In addition, as the first halosilane-based gas, for example, a tetrafluorosilane ($SiF_4$) gas, a tetrabromosilane ($SiBr_4$) gas, a tetraiodosilane ($SiI_4$) gas, or the like can be used. That is, as the first halosilane-based gas, for example, other than the chlorosilane-based gas, a halosilane-based gas such as a fluorosilane-based gas, a bromosilane-based gas, or an iodosilane-based gas can be used.

[Step G2]

After step G1 is completed, a second halosilane-based gas is supplied from the nozzle 249*e* to the wafer 200 in the process chamber 201, that is, to the cleaned surface of the wafer 200, and the inert gas is supplied from each of the nozzles 249*a* to 249*d*.

Specifically, the valve 243*e* is opened to cause the second halosilane-based gas to flow through the gas supply pipe 232*e*. The flow rate of the second halosilane-based gas is regulated by the MFC 241*e*, and the second halosilane-based gas is supplied into the process chamber 201 via the nozzle 249*e* and exhausted from the exhaust port 231*a*. At this time, the second halosilane-based gas is supplied to the wafer 200. In addition, at this time, the valves 243*f* to 243*i* are opened to supply the inert gas into the process chamber 201 via each of the nozzles 249*a* to 249*d*.

By supplying the second halosilane-based gas to the wafer 200 under the processing conditions described later, an Si element contained in the second halosilane-based gas can be adsorbed onto the surface of the wafer 200 cleaned in step G1 to form seeds (nuclei). A crystal structure of a nucleus formed on the surface of the wafer 200 becomes amorphous under the processing conditions described later.

After the nuclei are formed on the surface of the wafer 200, the valve 243*e* is closed to stop the supply of the second halosilane-based gas into the process chamber 201. Then, the gas and the like remaining in the process chamber 201 are removed from the inside of the process chamber 201 by processing procedures similar to the purge step in step G1.

The halosilane-based gas described as the first halosilane-based gas can be used as the second halosilane-based gas.

The processing conditions in step G1 are exemplified as follows.

Supply flow rate of first halosilane-based gas: 100 to 1000 sccm

Supply time of first halosilane-based gas: 1 to 30 minutes

Supply flow rate of inert gas (per gas supply pipe): 1000 to 3000 sccm

Processing temperature (first temperature): 300 to 500° C.

Processing pressure: 2 to 1000 Pa

The processing conditions in step G2 are exemplified as follows.

Supply flow rate of second halosilane-based gas or second reducing gas: 50 to 1000 sccm Supply time of second halosilane-based gas or second reducing gas: 10 seconds to 5 minutes Other processing conditions are similar to the processing conditions in step G1.

Here, in the present disclosure, the expression of the numerical range such as "2 to 1000 Pa" means that a lower limit value and an upper limit value are included in the range. Therefore, for example, "2 to 1000 Pa" means "2 Pa or more and 1000 Pa or less". The same applies to other numerical ranges. Furthermore, the processing temperature means the temperature of the wafer 200, and the processing pressure means the pressure in the process chamber 201. In addition, "gas supply flow rate: 0 sccm" means a case where the gas is not supplied. The same applies to the following description.

As the inert gas, for example, an $N_2$ gas or a rare gas such as an Ar gas, a He gas, a Ne gas, or a Xe gas can be used. The same applies to a temperature elevation step, a film forming step, and the like described later.

(Temperature Elevation Step)

After the seed layer forming step is completed, the output of the heater 207 is regulated to change the temperature in the process chamber 201 to a second temperature higher than the first temperature described above. When performing this step, the valves 243*f* to 243*j* are opened to supply the inert gas into the process chamber 201 via the nozzles 249*a* to 249*e*. Thus, the inside of the process chamber 201 is purged. After the temperature in the process chamber 201 reaches the second temperature and is stabilized, the film forming step described later starts.

(Film Forming Step)

The film forming step includes sequentially performing:

step A of supplying a group 14 element-containing gas; and step E of performing a cycle a predetermined number of times after step A, the cycle including: step B of supplying a dopant gas containing a halide of a group 13 element or a group 15 element; step C of supplying a first reducing gas; and step D of supplying the group 14 element-containing gas in this order.

Furthermore, after step E, step F of supplying the group 14 element-containing gas is performed.

[Step A]

In this step, a group 14 element-containing gas is supplied from the nozzle 249*a* to the wafer 200 in the process chamber 201, that is, to the surface of the seed layer formed on the wafer 200, and the inert gas is supplied from each of the nozzles 249*b* to 249*e*.

Specifically, the valve 243*a* is opened to cause the group 14 element-containing gas to flow through the gas supply pipe 232*a*. The flow rate of the group 14 element-containing gas is regulated by the MFC 241*a*, and the group 14 element-containing gas is supplied into the process chamber 201 via the nozzle 249*a* and exhausted from the exhaust port 231*a*. In addition, at this time, the valves 243*g* to 243*j* are opened to supply the inert gas into the process chamber 201 via each of the nozzles 249*b* to 249*e*.

By supplying the group 14 element-containing gas to the wafer 200 from the nozzle 249*a* under processing conditions described later, a film containing a group 14 element as a main element can be formed on the surface of the wafer 200, that is, on the seed layer formed on the wafer 200.

The processing conditions in step Aare exemplified as follows.

Supply flow rate of group 14 element-containing gas: 100 to 3000 sccm

Supply time of group 14 element-containing gas: 1 to 30 minutes

Supply flow rate of inert gas (per gas supply pipe): 100 to 2000 sccm

Processing temperature (second temperature): 300 to 600° C.

Processing pressure: 1 to 1000 Pa

The processing conditions exemplified herein are conditions under which the group 14 element-containing gas is thermally decomposed when the group 14 element-containing gas exists alone in the process chamber 201, that is, conditions under which a CVD reaction occurs. That is, the processing conditions exemplified herein are conditions under which the adsorption (deposition) of the group 14 element onto the wafer 200 is not self-limited, that is, conditions under which the adsorption of the group 14 element onto the wafer 200 becomes non-self-limited.

As the group 14 element-containing gas, for example, a silicon hydride gas such as a monosilane ($SiH_4$, abbreviation: MS) gas, a disilane ($Si_2H_6$, abbreviation: DS) gas, a trisilane ($Si_3H_8$) gas, a tetrasilane ($Si_4H_{10}$) gas, a pentasilane ($Si_5H_{12}$) gas, or a hexasilane ($Si_6H_{14}$) gas, or a germanium hydride gas such as a germane ($GeH_4$) gas, a digermane ($Ge_2H_6$) gas, a trigermane ($Ge_3H_8$) gas, a tetragermane ($Ge_4H_{10}$) gas, a pentagermane ($Ge_5H_{12}$) gas, or a hexagermane ($Ge_6H_{14}$) gas can be used.

The group 14 element-containing gas is preferably, for example, one selected from the group of a monosilane ($SiH_4$, abbreviation: MS) gas, a disilane ($Si_2H_6$, abbreviation: DS) gas, a trisilane ($Si_3H_8$) gas, a germane ($GeH_4$) gas, a digermane ($Ge_2H_6$) gas, and a trigermane ($Ge_3H_8$) gas. These gases react (decompose) relatively easily, so that the deposition rate can be improved.

[Step E]

In step E, a cycle including the following steps B, C, and D in this order is performed a predetermined number of times (n times, n being an integer of two or more). By step E, a film doped with a group 13 element or a group 15 element, containing a group 14 element as a main element, and with small surface roughness can be formed on the wafer 200.

[Step B]

After step A is completed, a dopant gas containing a halide of a group 13 element or a group 15 element is supplied from the nozzle 249*b* to the wafer 200 in the process chamber 201, that is, to the surface of the film that contains a group 14 element as a main element and is formed on the wafer 200, and the inert gas is supplied from each of the nozzles 249*a* and 249*c* to 249*e*.

Specifically, the valve 243*b* is opened to cause the dopant gas to flow through the gas supply pipe 232*b*. The flow rate of the dopant gas is regulated by the MFC 241*b*, and the dopant gas is supplied into the process chamber 201 via the nozzle 249*b* and exhausted from the exhaust port 231*a*. In addition, at this time, the valves 243*f* and 243*h* to 243*j* are opened to supply the inert gas into the process chamber 201 via each of the nozzles 249*a* and 249*c* to 249*e*.

By supplying the dopant gas to the wafer 200 from the nozzle 249*b* under processing conditions described later, a film containing a halide of a group 13 element or a group 15 element as a main component can be formed on the film that contains a group 14 element as a main element and is formed on the wafer 200.

As the dopant gas containing a halide of a group 13 element, a gas such as a trichloroborane ($BCl_3$) gas or the like containing an element (boron (B) or the like) that is a group 13 element and becomes solid by itself can be used.

In addition, as the dopant gas containing a halide of a group element, for example, a gas such as a phosphorus trichloride ($PCl_3$) gas or the like containing an element (P, arsenic (As) or the like) that is a group 15 element and becomes solid by itself can be used.

As the dopant gas, a dopant gas containing a B element is preferable. For example, by using a $BCl_3$-containing gas, a film can be easily formed even when the surface of the wafer 200 includes a fine structure.

As the dopant gas, a dopant gas containing a Cl element in addition to a B element is preferable. For example, the Cl element of $BCl_3$ adsorbed onto the film containing a group 14 element as a main element inhibits the adsorption of a group 14 element-containing gas onto the film, but is easily reduced in step C, leading to the desorption of the Cl element. Therefore, the adsorption of the group 14 element-containing gas onto the film is promoted in steps D and F, and the deposition rate can be improved.

[Step C]

After step B is completed, a first reducing gas is supplied from the nozzle 249*c* to the wafer 200 in the process chamber 201, that is, to the surface of the film that contains a halide of a group 13 element or a group 15 element as a main component and is formed on the wafer 200, and the inert gas is supplied from each of the nozzles 249*a*, 249*b*, 249*d*, and 249*e*.

Specifically, the valve 243*c* is opened to cause the first reducing gas to flow through the gas supply pipe 232*c*. The flow rate of the first reducing gas is regulated by the MFC 241*c*, and the first reducing gas is supplied into the process chamber 201 via the nozzle 249*c* and exhausted from the exhaust port 231*a*. In addition, at this time, the valves 243*f*, 243*g*, 243*i*, and 243*j* are opened to supply the inert gas into the process chamber 201 via each of the nozzles 249*a*, 249*b*, 249*d*, and 249*e*.

By supplying the first reducing gas to the wafer 200 from the nozzle 249*c* under processing conditions described later, a halogen element can be reduced and removed from the surface of the wafer 200, that is, from the film that contains a halide of a group 13 element or a group 15 element as a main component and is formed on the wafer 200. By step C, a film containing a group 13 element or a group 15 element as a main element can be formed.

As the first reducing gas, for example, a hydrogen-based gas such as a hydrogen ($H_2$) gas, a hydrogen-containing gas, an activated hydrogen gas can be used. As the activated hydrogen gas, for example, a gas that is activated by plasma is named.

As the first reducing gas, a hydrogen-containing gas is preferably used. With the use of a hydrogen-containing gas, the halogen element that inhibits the adsorption of the group 14 element-containing gas onto the film is easily reduced and desorbed. Therefore, the adsorption of the group 14 element onto the film is promoted in steps D and F, and the deposition rate can be improved.

[Step D]

After step C is completed, the group 14 element-containing gas is supplied from the nozzle 249*a* to the wafer 200 in the process chamber 201, that is, to the surface of the film that contains a group 13 element or a group 15 element as a main element and is formed on the wafer 200, and the inert gas is supplied from each of the nozzles 249*b* to 249*e*.

Specifically, the valve 243*a* is opened to cause the group 14 element-containing gas to flow through the gas supply pipe 232*a*. The flow rate of the group 14 element-containing gas is regulated by the MFC 241*a*, and the group 14 element-containing gas is supplied into the process chamber 201 via the nozzle 249*a* and exhausted from the exhaust port 231*a*. In addition, at this time, the valves 243*g* to 243*j* are opened to supply the inert gas into the process chamber 201 via each of the nozzles 249*b* to 249*e*.

By supplying the group 14 element-containing gas to the wafer 200 from the nozzle 249*a* under processing conditions described later, a film containing a group 14 element as a main element can be formed on the surface of the wafer 200, that is, on the film that contains a group 13 element or a group 15 element as a main element and is formed on the wafer 200.

As the group 14 element-containing gas, the gas described above in step A can be used.

The processing conditions in step B are exemplified as follows.

Supply flow rate of dopant gas: 10 to 400 sccm
Supply time of dopant gas: 1 to 30 minutes
Supply flow rate of inert gas (per gas supply pipe): 300 to 5000 sccm
Processing temperature (second temperature): 350 to 550° C.
Processing pressure: 0.1 to 1000 Pa The processing conditions in step C are exemplified as follows.

Supply flow rate of first reducing gas: 10 to 3000 sccm
Supply time of first reducing gas: 1 to 30 minutes
Other processing conditions are similar to the processing conditions in step B.

The processing conditions in step D are exemplified as follows.

Supply flow rate of group 14 element-containing gas: 10 to 3000 sccm
Supply time of group 14 element-containing gas: 0.1 to 30 minutes
Other processing conditions are similar to the processing conditions in step B.

[Step F]

After step E is completed, the group 14 element-containing gas is supplied from the nozzle 249*a* to the wafer 200 in the process chamber 201, that is, to the surface of the film that contains a group 14 element as a main element and is formed on the wafer 200, and the inert gas is supplied from each of the nozzles 249*b* to 249*e*.

Specifically, the valve 243*a* is opened to cause the group 14 element-containing gas to flow through the gas supply pipe 232*a*. The flow rate of the group 14 element-containing gas is regulated by the MFC 241*a*, and the group 14 element-containing gas is supplied into the process chamber 201 via the nozzle 249*a* and exhausted from the exhaust port 231*a*. In addition, at this time, the valves 243*g* to 243*j* are opened to supply the inert gas into the process chamber 201 via each of the nozzles 249*b* to 249*e*.

By supplying the group 14 element-containing gas to the wafer 200 from the nozzle 249*a* under processing conditions described later, a film containing a group 14 element as a main element can be further formed on the surface of the wafer 200, that is, on the film that contains a group 14 element as a main element and is formed on the wafer 200.

As the group 14 element-containing gas, the gas described above in step A can be used.

The processing conditions in step F are exemplified as follows.

Supply flow rate of group 14 element-containing gas: 10 to 5000 sccm
Supply time of group 14 element-containing gas: 1 to 30 minutes
Supply flow rate of inert gas (per gas supply pipe): 300 to 3000 sccm
Processing temperature (second temperature): 350 to 550° C.
Processing pressure: 0.1 to 1000 Pa Other processing conditions are similar to the processing conditions in step B.

(After-Purge and Atmospheric Pressure Restoration)

After the Si film forming step is completed, an $N_2$ gas serving as a purge gas is supplied from each of the nozzles 249*a* to 249*c* into the process chamber 201 and is exhausted from the exhaust port 231*a*. As a result, the inside of the process chamber 201 is purged, and a gas and a reaction by-product remaining in the process chamber 201 are removed from the inside of the process chamber 201 (after-purge). Thereafter, the atmosphere in the process chamber 201 is replaced with the inert gas (inert gas replacement), so that the pressure in the process chamber 201 is restored to the normal pressure (atmospheric pressure restoration).

(Boat Unload and Wafer Discharge)

The seal cap 219 is lowered by the boat elevator 115, and the lower end of the manifold 209 is opened. Then, the processed wafers 200 are unloaded from the lower end of the manifold 209 to the outside of the reaction tube 203 in a state where the processed wafers 200 are supported by the boat 217 (boat unload). After the boat unload, the shutter 219*s* is moved, and the lower end opening of the manifold 209 is sealed by the shutter 219*s* with the O-ring 220*c* interposed therebetween (shutter close). After being unloaded to the outside of the reaction tube 203, the processed wafers 200 are taken out from the boat 217 (wafer discharge).

(3) EFFECTS OF EMBODIMENTS

According to the embodiments, one or more of the following effects can be obtained.

(a) In the film forming step, a film containing a group 14 element as a main element is formed on a seed layer in step A. This makes it possible to suppress an increase in surface roughness when a film containing a halide of a group 13 element or a group element as a main component is formed in step B.

(b) A halogen element can be reduced and removed from the film containing a halide of a group 13 element or a group 15 element as a main component in step C, so that a film containing a group 13 element or a group 15 element as a main element can be formed. Therefore, it is possible to suppress the inhibition, by a halogen element, of the adsorption of the group 14 element-containing gas onto the film in step D.

(c) A film containing a group 14 element as a main element is provided, as a Cap layer, on the film containing a group 13 element or a group 15 element as a main element in step D. Therefore, it is possible to suppress desorption of the dopant (that is, the group 13 element or the group 15 element) from the film.

(d) In addition, by providing, as a Cap layer, the film containing a group 14 element as a main element on the film containing a group 13 element or a group 15 element as a main element in step D, it is possible to suppress an increase in surface roughness due to the desorption of the dopant from the film.

(e) By step E of performing a cycle including such steps B to D in this order a predetermined number of times, a film doped with a group 13 element or a group 15 element, containing a group 14 element as a main element, and with small surface roughness can be formed.

(f) By further performing step F in the film forming step, the thickness of the Cap layer of the film on the wafer 200 can be increased, and the desorption of the dopant from the film can be further suppressed.

(g) A seed layer is formed in the seed layer forming step, so that the surface roughness of the film formed on the wafer 200 can be reduced.

(4) MODIFIED EXAMPLES

The film forming step in some embodiments is not limited to that in the embodiments illustrated in FIGS. 4 and 5, and can be changed as in the following modified examples. These modified examples can be arbitrarily combined. Unless otherwise specifically described, the processing procedures and processing conditions in each step of each of the modified examples can be similar to the processing procedures and processing conditions in each step of the substrate processing sequence described above.

Modified Example 1

In the film forming sequence illustrated in FIGS. 4 and 5, an example has been described in which step G, that is, the seed layer forming step is performed. However, step G may not be performed.

Modified Example 2

In the film forming sequence illustrated in FIGS. 4 and 5, an example has been described in which step C, that is, the step of supplying a first reducing gas is performed. However, step C may not be performed.

Modified Example 3

In the film forming sequence illustrated in FIGS. 4 and 5, a dopant containing a halide of a group 13 element or a group 15 element is used in step B. However, a dopant containing a non-halide of a group 13 element or a group 15 element, for example, a hydride may be used.

As the dopant gas containing a hydride of a group 13 element, a gas such as a borane ($BH_3$) gas, a diborane ($B_2H_6$) gas, or the like containing an element (boron (B) or the like) that is a group 13 element and becomes solid by itself can be used.

In addition, as the dopant gas containing a hydride of a group element, a gas such as a phosphine ($PH_3$, abbreviation: PH) gas, an arsine ($AsH_3$) gas, or the like containing an element (P, arsenic (As) or the like) that is a group 15 element and becomes solid by itself can be used.

Furthermore, in a case where a non-halide of a group 13 element or a group 15 element is used, an element not containing nitrogen (N) is selected as the group 15 element in the present disclosure.

Modified Example 4

In the film forming sequence illustrated in FIGS. 4 and 5, an example has been described in which step F is performed. However, step F may not be performed.

Modified Example 5

The supply time of the group 14 element-containing gas in step D may be set longer than the supply time of the group 14 element-containing gas in step A in at least the last cycle in step E. This makes it possible to increase the thickness of the Cap layer formed in step E while shortening the film forming time in step A, so that the desorption of the dopant from the film on the wafer 200 can be suppressed.

In addition, the supply time of the group 14 element-containing gas in step D may be set longer than the supply time of the group 14 element-containing gas in step A in all the cycles in step E. This makes it possible to increase the thickness of all the films formed in step D, so that the desorption of the dopant from the film on the wafer 200 can be further suppressed.

The supply time of the group 14 element-containing gas in step D may be, for example, one to ten times the supply time of the group 14 element-containing gas in step A.

Modified Example 6

In the film forming sequence illustrated in FIGS. 4 and 5, an example has been described in which steps G1 and G2 are each performed once in this order in step G. However, a cycle in which steps G1 and G2 are alternately performed, that is, not synchronously but non-simultaneously performed may be performed a predetermined number of times (m times, m being an integer of one or more). This makes it possible to form a seed layer, in which nuclei are formed at high density, described above, on the wafer 200.

Modified Example 7

In the film forming sequence illustrated in FIGS. 4 and 5, an example has been described in which step G2 is performed in step G. However, step G2 may not be performed.

Modified Example 8

In the film forming sequence illustrated in FIGS. 4 and 5, an example has been described in which a second halosilane-based gas is supplied in step G2 in step G. However, a second reducing gas may be supplied instead of the second halosilane-based gas. In a case where the second reducing gas is supplied instead of the second halosilane-based gas, step G2 may be performed by processing procedures similar to those in the case where the second halosilane-based gas is used.

As the second reducing gas, for example, a silicon hydride gas such as a hydrogen ($H_2$) gas, a monosilane ($SiH_4$, abbreviation: MS) gas, a disilane ($Si_2H_6$, abbreviation: DS) gas, a trisilane ($Si_3H_8$) gas, a tetrasilane ($Si_4H_{10}$) gas, a pentasilane ($Si_5H_{12}$) gas, or a hexasilane ($Si_6H_{14}$) gas can be used. As the second reducing gas, a gas containing a Si element may be used. By using the second reducing gas, the surface roughness of the film formed on the wafer 200 can be reduced.

In a case where the second reducing gas contains a Si element, Si contained in the second reducing gas can be adsorbed onto the surface of the wafer 200 cleaned in step G1 to form seeds (nuclei). In addition, the halogen element derived from the first halosilane gas can be reduced and removed from the wafer 200 cleaned in step G1 by the H element contained in the second reducing gas. As a result, the surface roughness of the film formed on the wafer 200 can be reduced.

Modified Example 9

In the film forming step, for example, a film may be formed on the wafer 200 by the following film forming sequence.

$$MS \rightarrow (BCl_3 \rightarrow H_2 \rightarrow MS) \times n$$

$$MS \rightarrow (BCl_3 \rightarrow H_2 \rightarrow MS) \times n \rightarrow MS$$

Modified Example 10

In the seed layer forming step, that is, in step G, for example, a seed layer may be formed on the wafer 200 by the following film forming sequence.

$$(MS \rightarrow HCDS) \times m$$

$$(DCS \rightarrow DS) \times m$$

$$(HCDS \rightarrow H_2) \times m$$

$$(HCDS — SiH_4) \times m$$

$$(HCDS \rightarrow Si_2H_6) \times m$$

Modified Example 11

Figure 6:
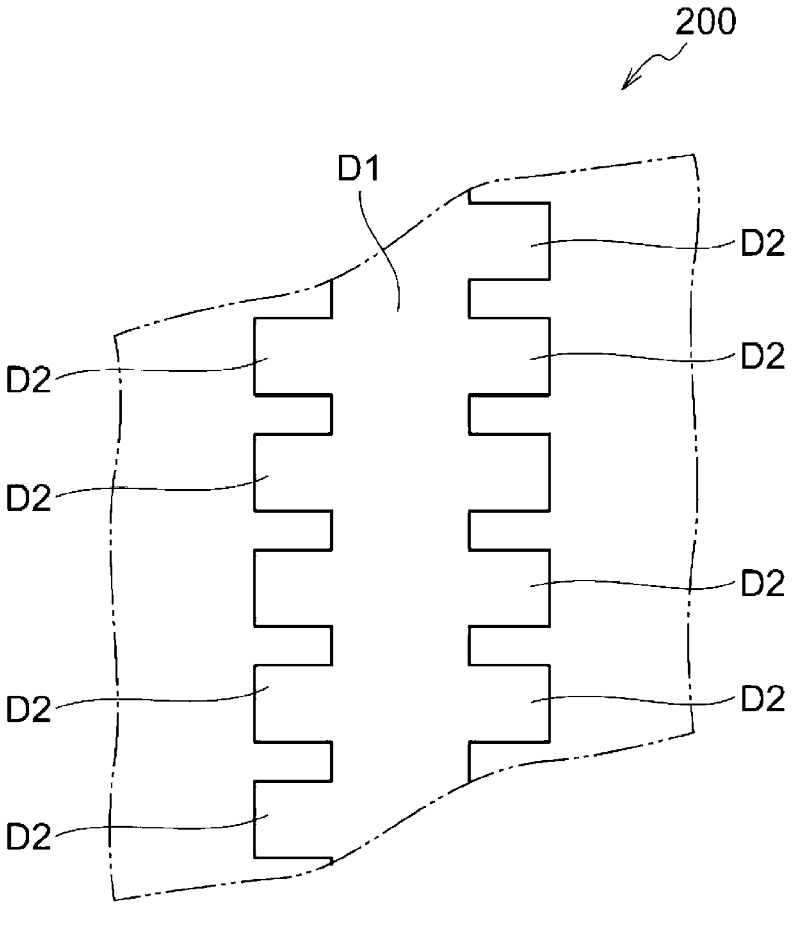
FIG. 6 is a plan view partially illustrating a substrate used in some embodiments of the present disclosure.

The wafer 200 serving as a substrate may be a wafer, the surface of which has been subjected to fine processing in advance, thereby including a fine structure. For example, as illustrated in FIG. 6, a first concave portion D1 extending in a direction perpendicular to the surface of the wafer 200 may be formed in the surface of the wafer 200. In addition, for example, as illustrated in FIG. 6, a plurality of second concave portions D2 that communicate with the first concave portion D1 perpendicularly to the longitudinal direction of the first concave portion D1 and extend in the in-plane direction of the wafer 200 may be formed. The first concave portion D1 means a trench or a hole, and the second concave portion D2 means a space that is formed in the trench or the hole and in which a floating gate is formed. In the film forming step in the present disclosure, a film is formed in the first concave portion D1 and the second concave portions D2. By the film forming step in the present disclosure, a film with small surface roughness can be formed even when the wafer 200 includes a fine structure. That is, a film can be uniformly formed in the first concave portion D1 and the second concave portions D2.

OTHER EMBODIMENTS

Some embodiments of the present disclosure have been specifically described above. However, the present disclosure is not limited to the embodiments described above, and various modifications can be made without departing from the gist of the present disclosure.

In the embodiments described above, an example has been described in which the nozzles 249*a* to 249*e* are provided adjacent to one another (in close proximity to one another). However, the present disclosure is not limited to such embodiments. For example, the nozzles 249*a*, 249*b*, 249*d*, and 249*e* may be provided in the annular space between the inner wall of the reaction tube 203 and the wafer 200 in a plan view, at locations away from the nozzle 249*c*.

In the embodiments described above, an example has been described in which the nozzles 249*a* to 249*e* serve as the first to fifth suppliers, respectively, and the five nozzles are provided in the process chamber 201. However, the present disclosure is not limited to such embodiments. For example, at least one selected from the group of first to fifth suppliers may include two or more nozzles. In addition, a nozzle other than the first to fifth suppliers may be newly provided in the process chamber 201, and an inert gas or various process gases may be further supplied using this nozzle. In a case where a nozzle other than the nozzles 249*a* to 249*e* is provided in the process chamber 201, the newly provided nozzle may be provided at a location facing the exhaust port 231*a* in a plan view, or may be provided at a location not facing the exhaust port 231*a*. That is, the newly provided nozzle may be provided at a location away from the nozzles 249*a* to 249*e*, for example, in the annular space between the inner wall of the reaction tube 203 and the wafer 200 in a plan view, at an intermediate location between the nozzles 249*a* to 249*e* and the exhaust port 231*a* or a location near the intermediate location along the outer peripheries of the wafers 200.

Preferably, recipes used in the substrate processing are individually prepared according to the processing contents, and are stored in the memory 121*c* through a telecommunication line or the external memory 123. Then, at the start of the substrate processing, the CPU 121*a* preferably properly selects an appropriate recipe from among the plurality of recipes stored in the memory 121*c* according to the contents of the substrate processing. As a result, it is possible to form films having various film types, composition ratios, film qualities, and film thicknesses with good reproducibility by using one substrate processing apparatus. In addition, it is possible to reduce a burden on an operator and to quickly start the substrate processing while avoiding an operation error.

The recipes described above are not limited to newly created recipes, but may be prepared by, for example, changing the existing recipes already installed in the substrate processing apparatus. In the case of changing the recipes, the changed recipes may be installed in the substrate processing apparatus through a telecommunication line or a recording medium in which the recipes are recorded. In addition, the existing recipes already installed in the substrate processing apparatus may be directly changed by operating the input/output device 122 included in the existing substrate processing apparatus.

In the embodiments described above, an example has been described in which films are formed by using a batch-type substrate processing apparatus that processes a plurality of substrates at a time. The present disclosure is not limited to the embodiments described above, and can also be suitably applied to a case where films are formed by using a single wafer type substrate processing apparatus that processes one or more substrates at a time, for example. In addition, in the embodiments described above, an example has been described in which films are formed by using a substrate processing apparatus including a hot wall-type process furnace. The present disclosure is not limited to the embodiments described above, and can also be suitably applied to a case where films are formed by using a substrate processing apparatus including a cold wall-type process furnace.

Even in a case where these substrate processing apparatuses are used, films can be formed according to sequences and processing conditions similar to those in the embodiments and modified examples described above. Therefore, effects similar to those in the embodiments and modified examples described above can be obtained.

In addition, the embodiments and modified examples described above, and the like can be properly combined and used. Processing procedures and processing conditions at this time can be similar to the processing procedures and the processing conditions in the embodiments described above, for example.

The various effects described in the present disclosure are obtained with a similar tendency not only when a film is formed on a substrate under the conditions that the process gas supplied to the substrate is thermally decomposed (under non-self-limited conditions) but also when a film is formed on a substrate under the conditions that the process gas supplied to the substrate is not thermally decomposed (under self-limited conditions). However, the effect relating to the regulation of the in-plane film thickness distribution among the various effects described above is particularly effectively obtained in a case where a film is formed on a substrate under the conditions that the process gas supplied to the substrate is thermally decomposed and the CVD reaction occurs.

According to the present disclosure, a film with a small surface roughness can be formed on a substrate.

What is claimed is:

1. A method of processing a substrate, comprising:

(a) supplying a group 14 element-containing gas to a substrate; and (e) performing a cycle a predetermined number of times after (a), the cycle comprising: (b) supplying a dopant gas containing a halide of a group 13 element or a group 15 element to the substrate; (c) supplying a first reducing gas to the substrate; and (d) supplying the group 14 element-containing gas to the substrate in this order.

2. The method according to claim 1, wherein a time of the supplying in (d) is set longer than a time of the supplying in (a) in at least the cycle performed at last in (e).

3. The method according to claim 2, wherein the time of the supplying in (d) is set longer than the time of the supplying in (a) in every cycle performed as the cycle in (e).

4. The method according to claim 1, further comprising (f) supplying the group 14 element-containing gas to the substrate after (e).

5. The method according to claim 1, further comprising (g) supplying a halosilane-based gas to the substrate before (a).

6. The method according to claim 5, wherein the halosilane-based gas includes two types of halosilane-based gases, and the two types of halosilane-based gases are supplied in (g).

7. The method according to claim 5, wherein after the supplying of the halosilane-based gas in (g), a second reducing gas is supplied.

8. The method according to claim 7, wherein the second reducing gas contains a Si element.

9. The method according to claim 1, wherein the group 14 element-containing gas contains at least one selected from the group of a $SiH_4$ gas, a $Si_2H_6$ gas, a $Si_3H_8$ gas, a $GeH_4$ gas, a $Ge_2H_6$ gas, and a $Ge_3H_8$ gas.

10. The method according to claim 1, wherein the dopant gas contains a B element.

11. The method according to claim 10, wherein the dopant gas contains a Cl element.

12. The method according to claim 1, wherein the first reducing gas is a hydrogen-containing gas.

13. The method according to claim 1, wherein the substrate includes a surface in which a first concave portion extending in an in-plane direction of the substrate is formed.

14. The method according to claim 13, wherein in the surface of the substrate, a plurality of second concave portions that communicate with the first concave portion perpendicularly to a longitudinal direction of the first concave portion and extend in the in-plane direction of the substrate are formed.

15. A method of manufacturing a semiconductor device comprising the method of claim 1.

16. A non-transitory computer-readable recording medium storing a program that causes, by a computer, a substrate processing apparatus to perform a process comprising:

(a) supplying a group 14 element-containing gas to a substrate; and (e) performing a cycle a predetermined number of times after (a), the cycle comprising: (b) supplying a dopant gas containing a halide of a group 13 element or a group 15 element to the substrate; (c) supplying a first reducing gas to the substrate; and (d) supplying the group 14 element-containing gas to the substrate in this order.

* * * * *